(12) United States Patent
Saito et al.

(10) Patent No.: US 7,566,116 B2
(45) Date of Patent: Jul. 28, 2009

(54) INK JET HEAD CIRCUIT BOARD, METHOD OF MANUFACTURING THE SAME AND INK JET HEAD USING THE SAME

(75) Inventors: Ichiro Saito, Yokohama (JP); Toshiyasu Sakai, Yokohama (JP); Teruo Ozaki, Yokohama (JP); Sakai Yokoyama, Kawasaki (JP); Kenji Ono, Setagaya-Ku (JP); Satoshi Ibe, Yokohama (JP); Kazuaki Shibata, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 363 days.

(21) Appl. No.: 11/264,160

(22) Filed: Nov. 2, 2005

(65) Prior Publication Data
US 2006/0098053 A1  May 11, 2006

(30) Foreign Application Priority Data
Nov. 9, 2004  (JP)  ............... 2004-325534

(51) Int. Cl.
*B41J 2/05*  (2006.01)

(52) U.S. Cl. .......................... 347/64; 347/59

(58) Field of Classification Search ............. 347/62–64, 347/59
See application file for complete search history.

(56) References Cited

U.S. PATENT DOCUMENTS

| | | | |
|---|---|---|---|
| 4,723,129 A | 2/1988 | Endo et al. | |
| 4,740,796 A | 4/1988 | Endo et al. | |
| 5,485,185 A * | 1/1996 | Sueoka et al. | 347/64 |
| 5,660,739 A | 8/1997 | Ozaki et al. | |
| 6,315,396 B1 | 11/2001 | Ozaki et al. | |
| 6,357,862 B1 | 3/2002 | Ozaki et al. | |
| 6,435,660 B1 | 8/2002 | Ozaki et al. | |
| 6,468,437 B1 | 10/2002 | Kashino et al. | |
| 6,485,131 B1 | 11/2002 | Saito et al. | |
| 6,530,650 B2 | 3/2003 | Ozaki et al. | |
| 6,644,790 B2 | 11/2003 | Ozaki et al. | |
| 6,663,228 B2 | 12/2003 | Saito et al. | |
| 7,055,937 B2 | 6/2006 | Suzuki et al. | |
| 2006/0033778 A1 | 2/2006 | Shibata et al. | |
| 2006/0033779 A1 | 2/2006 | Shibata et al. | |
| 2006/0033782 A1 | 2/2006 | Sakai et al. | |
| 2006/0061626 A1 | 3/2006 | Saito et al. | |
| 2006/0098053 A1 | 5/2006 | Saito et al. | |

FOREIGN PATENT DOCUMENTS

JP  8112902  5/1996

* cited by examiner

*Primary Examiner*—An H Do
(74) *Attorney, Agent, or Firm*—Fitzpatrick, Cella, Harper & Scinto

(57) ABSTRACT

In an ink jet head circuit board including a heater for generating thermal energy used for ejecting ink in response to application of electricity, a drop in thermal energy efficiency is prevented while reducing an area of the heater to achieve higher-resolution and higher-image-quality printing, and damages on the heater attributable to a manufacturing process are avoided. To achieve this, a resistor layer is disposed on an electrode wire layer; and two protective layers are disposed thereon. Then the upper protective layer is removed in a site above the heater. Accordingly, it is possible to dispose the protective layers without causing a decrease in an effective bubble generating region, and to improve thermal energy efficiency by reducing the effective thickness of the protective layer above the heater. Moreover, the resistor layer is covered with the first protective layer and is thereby prevented from adverse effects in the manufacturing process such as etching processes.

5 Claims, 12 Drawing Sheets

US 7,566,116 B2

INK JET HEAD CIRCUIT BOARD, METHOD OF MANUFACTURING THE SAME AND INK JET HEAD USING THE SAME

BACKGROUND OF THE INVENTION

1. Field of the Invention

The present invention relates to a circuit board for an ink jet head that ejects ink for printing, a method of manufacturing the circuit board, and an ink jet head using the circuit board.

2. Description of the Related Art

An ink jet printing system has a characteristic that it is possible to print a high-definition image at a high speed by ejecting a very small amount of ink out of a nozzle in the form of droplets, for example. There are a variety of ejection methods available for the ink jet printing head (hereinafter referred simply as a printing head when appropriate) to realize the ink jet printing system. Among them, ink jet heads using methods of ejecting ink by use of thermal energy have been disclosed in U.S. Pat. Nos. 4,723,129, 4,740,796, and the like. A head according to the foregoing methods includes an ink jet head circuit board provided with a plurality of heaters for heating ink and generating bubbles as well as wires and other constituents for establishing electrical connection to the heaters, all of which are fabricated on one substrate. Moreover, in a general configuration, nozzles for ejecting the ink are formed thereon in positions corresponding to the heaters. This configuration allows easy and high-precision production of ink jet head circuit boards incorporating high-density layouts of resistors, wires, and the like through a process similar to a semiconductor manufacturing process. Accordingly, this configuration can realize printing at higher resolution and higher speed. In addition, by using this configuration, it is possible to form a smaller ink jet head and eventually to form a smaller printer using such an ink jet head.

FIG. 1 is a schematic plan view showing a typical configuration of one heater and the vicinity thereof to be disposed on the printing head circuit board disclosed in the above-mentioned patent documents. In a circuit board 1100, an electrode wire layer 1105 is formed as an upper layer of a resistor layer 1104, and a heater 1104' is formed by removing a portion of the electrode wire layer 1105 and exposing the resistor layer of that portion. An electrode wiring pattern is wired on the circuit board 1100 and is connected to a drive element circuit and an external power supply terminal. In this way, it is possible to receive power supply from outside. Here, the resistor layer 1104 is made of a material having a high electric resistance value. By applying a current from outside through the electrode wire layer 1105, the heater 1104' corresponding to the portion without the electrode wire layer 1105 generates thermal energy and generates a bubble in ink.

FIG. 2 is a schematic cross-sectional view of the ink jet head circuit board 1100 taken along the II-II line in FIG. 1 in a position corresponding to a liquid passage. In FIG. 2, reference numeral 1101 denotes a substrate made of Si, reference numeral 1102 denotes a heat accumulating layer made of a thermally oxidized film, and reference numeral 1103 denotes an interlayer film incorporating a heat accumulating function which is made of a SiO film, a SiN film, or the like. The resistor layer 1104 is formed on the interlayer film 1103, and the electrode wire layer 1105 made of metal such as Al, Ai-Si or Al-Cu is further formed thereon. Moreover, the heater 1104' is formed by partially removing the electrode wire layer 1105 and exposing the resistor layer of that portion. The electrode wire layer 1105 is wired in the circuit board 1100 and is connected to the drive element circuit and the external power supply terminal. In this way, it is possible to receive power supply from outside.

Further, a protective layer 1106 made of a SiO film, a SiN film, or the like is formed on the heater 1104' and on the electrode wire layer 1105 for protecting and insulating these constituents from the ink. Moreover, a high-durability protective layer 1107 is formed thereon as a layer which can endure damages caused by, for example, chemical impacts or physical impacts associated with generation of a bubble in ink. A region of the high-durability protective layer 1107 above the heater 1104', which contacts the ink, constitutes a heat applying portion 1108.

Incidentally, the ink jet printing system has been facing demands for printing performances in higher resolution, higher image quality, and higher speed in recent years along with its diffusion. Among them, one solution for the demands for higher resolution and higher image quality is to reduce an amount of ejected ink per dot (to reduce a diameter of an ink droplet when ejecting the ink as a droplet). Conventionally, the shape of the nozzle has been modified (or an area of an orifice is reduce) and an area of the heater has been reduced in order to obtain a smaller ink droplet.

Meanwhile, as a solution for the demand for higher speed printing, it is deemed effective to effectuate ejection of numerous ink droplets in a short time period either by raising a drive frequency while reducing a width of an electric pulse for driving an electrothermal transducer element or by increasing the number of nozzles for ejecting the ink. However, when applying this solution, the heat generated by the heaters is accumulated in the circuit board and the temperature of the head is raised. Therefore, a printing operation needs to be interrupted from time to time. Such interruption will pose a new problem of reduction in recording throughput.

Accordingly, there has been an attempt to devise an appropriate layer constitution so as to apply the heat generated by the heater to the ink efficiently for ink ejection.

For example, heat conductivity is increased more when a layer between the heater and a surface contacting the ink is thinner and the heat escaping to the side other than the ink is reduced. For this reason, it is possible to suppress the problems of the heat accumulation and the temperature rise of the printing head, and to reduce power consumption for generating the bubbles. That is, energy efficiency is improved as the effective thickness of the protective layer on the heater becomes thinner. On the contrary, if the protective layer is too thin, a pin hole existing on the protective layer may expose the heater or cause insufficient coverage of a step portion of a wire due to a failure to cover the step portion of the wire adequately. As a result, the ink may enter from that portion and cause corrosion of the wire or the heater, and eventually, may cause degradation in reliability and reduction in an operating life.

To deal with these problems, Japanese Patent Application Laid-open No. 8-112902 (1996) discloses a configuration in which first and second protective layers are provided and the first protective layer is removed at a heat applying portion. In this configuration, it is possible to improve energy efficiency and reduce power consumption, and to improve reliability and extend the operating life as the protective layers.

FIG. 3 is a schematic cross-sectional view of the heat applying portion and its vicinity of an ink jet head circuit board disclosed in Japanese Patent Application Laid-open No. 8-112902 (1996). In this configuration, a first protective layer 1106a and a second protective layer 1106b are formed on an electrode wire layer 1105, and the first protective layer 1106a constituting a lower layer is removed in a position above a heater 1104'. Specifically, the first protective layer 1106a made of a SiO film, a SiN film, or the like is formed firstly and then only the portion of the first protective layer 1106a corresponding to the heat applying portion 1108 is removed by patterning and the like. Thereafter, the second protective layer 1106b made of a SiO film, a SiN film, or the like is formed and then a high-durability protective layer 1107 is lastly formed thereon. By forming the substantially thin protective layer above the heat applying portion 1108, thermal energy from a resistor layer 1104 can be transferred to the ink only through the second protective layer 1106b and the high-durability protective layer 1107. For this reason, it is possible to use the thermal energy more effectively while obtaining given protecting and insulating function from the second protective layer 1106b.

Here, in light of reducing an energy loss of the entire ink jet head system, it is effective to reduce a value of resistance of the electrode wires by increasing the thickness of the electrode wire layer. However, the increase in the thickness thereof means an increase in the level of the step portions to be formed by patterning. In consideration of the coverage of these step portions, it is inevitable to increase the thickness of the protective layers to some extent.

Now, in the configuration shown in FIG. 3, the first protective layer 1106a is removed at a site shifted from an end portion of the electrode wire layer 1105 facing a heater 1104' to inside of the heater in order to sufficiently cover a step at the end portion. Here, although the entire surface of the heater generates heat, it is known that generation of bubble occurs only in a region (hereinafter referred to as an effective bubble generating region) excluding regions on the peripheries of the heater extending several micrometers inward because of an increase in the amount of the heat escaping from those peripheral portions of the heater. When adopting the configuration disclosed in Japanese Patent Application Laid-open No. 8-112902 (1996) described above, the first protective layer 1106a is removed at the site shifted from the end of the electrode wire layer 1105 facing the heater 1104' to the inside of the heater. In other words, the first protective layer 1106a exists in the position shifted to the inside of the heater. For this reason, the actual effective bubble generating region is further limited and reduced, thereby degrading heat efficiency. That is, direct adoption of the technique disclosed in Japanese Patent Application Laid-open No. 8-112902 (1996) to the situation requiring a smaller area of the heater poses a problem of additional degradation of the heat efficiency.

Meanwhile, there is also an attempt to suppress a thermal energy loss generated at a wire or the like by increasing a value of resistance of a resistor while reducing a value of a current flowing on the entire ink jet head system. In terms of this request for higher resistance of the resistor, investigations for various materials and a method of reducing the thickness of the resistor have been attempted. Reduction in the thickness has a difficulty in satisfying various characteristics including manufacturing stability, characteristic stability, reliability, and the like. Nevertheless, there is a strong demand for satisfying the above-mentioned characteristics while reducing the thickness.

However, in the configuration shown in FIG. 3, the heater is formed by laminating the electrode wire layer on the resistor layer, patterning the electrode wire, and then patterning again after laminating the first protective layer 1106a. Accordingly, a surface of the resistor layer is affected by etching processes and the like applied to these patterning processes. That is, the surface is affected by plasma when dry etching is performed or is affected by an etchant when wet etching is performed. Moreover, the surface may be exposed to air in the course of delivery for conducting those etching processes. Due to these processes, the surface of the resistor layer may be oxidized or damaged by the etching processes, or absorb gas or water. As a result, variation and fluctuation in the values of resistance are sometimes observed. Moreover, reliability is sometimes degraded by partial oxidation or damages. As described above, it is difficult to satisfy the above-mentioned characteristics particularly when obtaining the configuration as shown in FIG. 3 while reducing the thickness of the resistor layer for a higher value of resistance. In addition, if there is a difference in a bubble generating phenomenon among the heaters due to the fluctuation of the values of resistance, it is not possible to ensure a given ink ejection amount in terms of each nozzle, and moreover, resulting in causing large fluctuation of the ink ejection amounts among the respective nozzles. This will lead to degradation in printing quality.

SUMMARY OF THE INVENTION

A principal object of the present invention is to solve the above-described problems according to the conventional ink jet head circuit board, to transfer thermal energy generated by a heat-generating heater to ink efficiently, and to achieve reduction in power consumption.

Another object of the present invention is to achieve a highly reliable ink ejecting operation while reducing fluctuation of values of resistance attributable to manufacturing process and stabilizing the values of resistance for a long period.

Still another object of the present invention is to provide a highly reliable and small ink jet head including high-density arrangement of nozzles while satisfying the above-mentioned features.

The present invention provides an ink jet head circuit board having a heater for generating thermal energy to be used for ejecting ink in response to application of electricity, which includes an electrode wire layer including a gap for forming the heater, a resistor layer disposed as an upper layer of the electrode wire layer inclusive of the gap, a first protective layer disposed as an upper layer of the resistor layer, and a second protective layer disposed as an upper layer of the first protective layer so as to define a gap above the heater which is wider than the gap.

The present invention also provides a method of manufacturing an ink jet head circuit board having a heater for generating thermal energy to be used for ejecting ink in response to application of electricity, which includes the steps of disposing an electrode wire layer including a gap for forming the heater on a substrate, disposing a film constituting a resistor layer as an upper layer of the electrode wire layer inclusive of the gap, disposing a film constituting a first protective layer as an upper layer of the resistor layer, disposing a second protective layer as an upper layer of the first protective layer, and removing the second protective layer in a site above the heater.

The present invention also provides an ink jet head which includes the above-described ink jet head circuit board, and an ink nozzle corresponding to the heater.

According to the present invention, the two protective layers are formed basically, and one of them (the second protective layer) is removed in the region involved in power consumption of the ink jet head, i.e., the region above the heater, in order to reduce the substantial thickness of the protective layers. In this way, it is possible to improve heat efficiency and to reduce power consumption. Moreover, by disposing the resistor layer above the electrode wire layer, it is possible to execute patterning for removing one of the protective layers (the second protective layer) in terms of a wider range than the gap of the electrode wire layer constituting the heater. In this way, reduction in the area of the heater is possible to achieve higher-resolution and higher-image-quality printing without causing a decrease in an effective bubble generating region.

In addition, the resistor layer is formed above the electrode wire layer and is covered with the first protective layer upon removal of the second protective layer. In this way, the heaters on the resistor layer have less variation in values of resistance attributable to the manufacturing process, which are also stable for a long period. Accordingly, it is possible to achieve a highly reliable ink ejecting operation.

Meanwhile, in this manner, it is also possible to provide a highly reliable and small ink jet head including high-density arrangement of nozzles.

The above and other objects, effects, features and advantages of the present invention will become more apparent from the following description of embodiments thereof taken in conjunction with the accompanying drawings.

DETAILED DESCRIPTION OF THE PREFERRED EMBODIMENTS

Now, the present invention will be described in detail with reference to the accompanying drawings. It is to be noted, however, that the present invention shall not be limited only to the embodiments to be described below It is needless to say that other appropriate configurations are applicable without departing from the scope of the present invention as defined in the appended claims insofar as such configurations can achieve the objects of the present invention.

(Embodiment of Ink Jet Head Circuit Board and Manufacturing Method of the Same)

Figure 1:
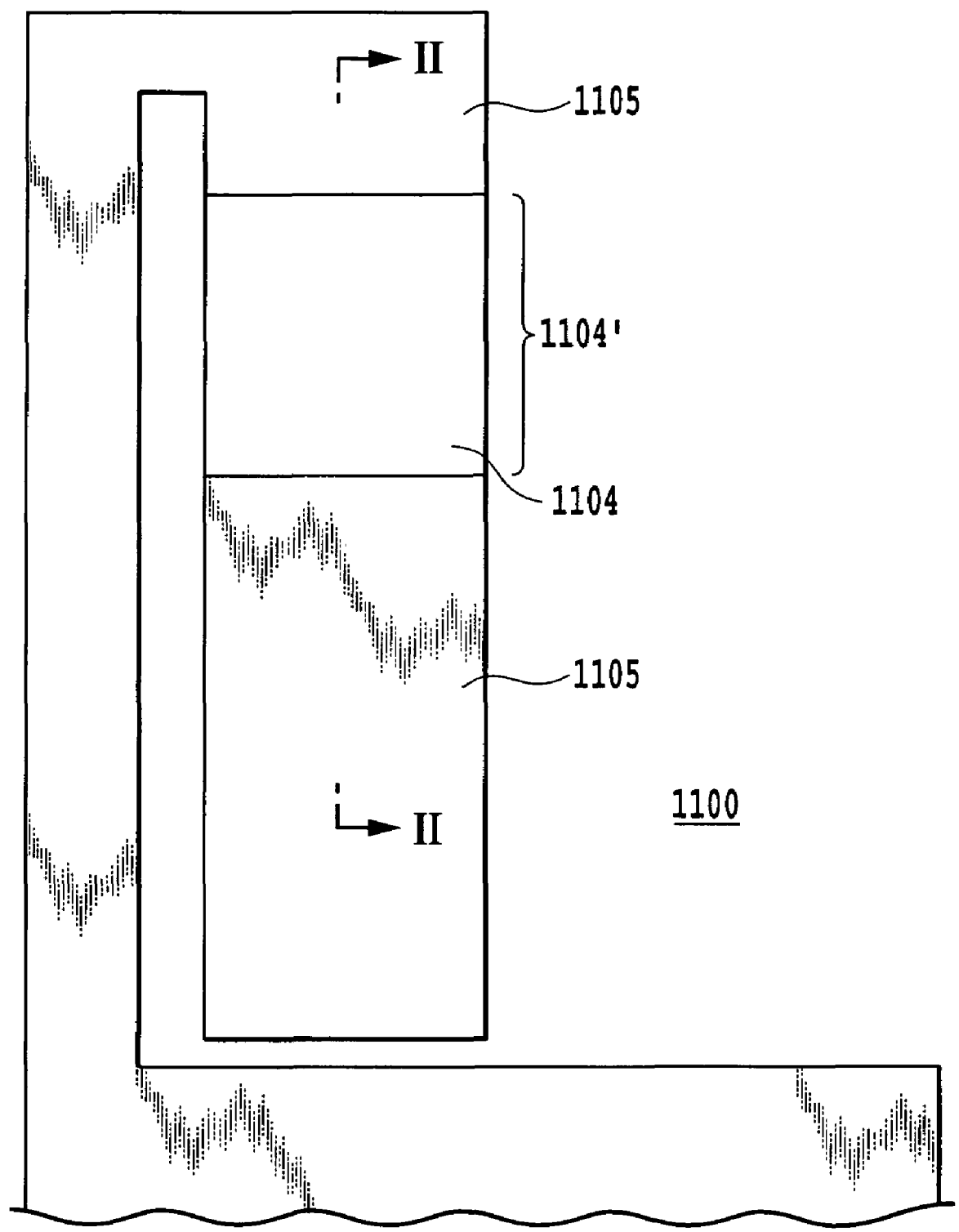
FIG. 1 is a schematic plan view of a heater of a conventional ink jet head circuit board.
Figure 2:
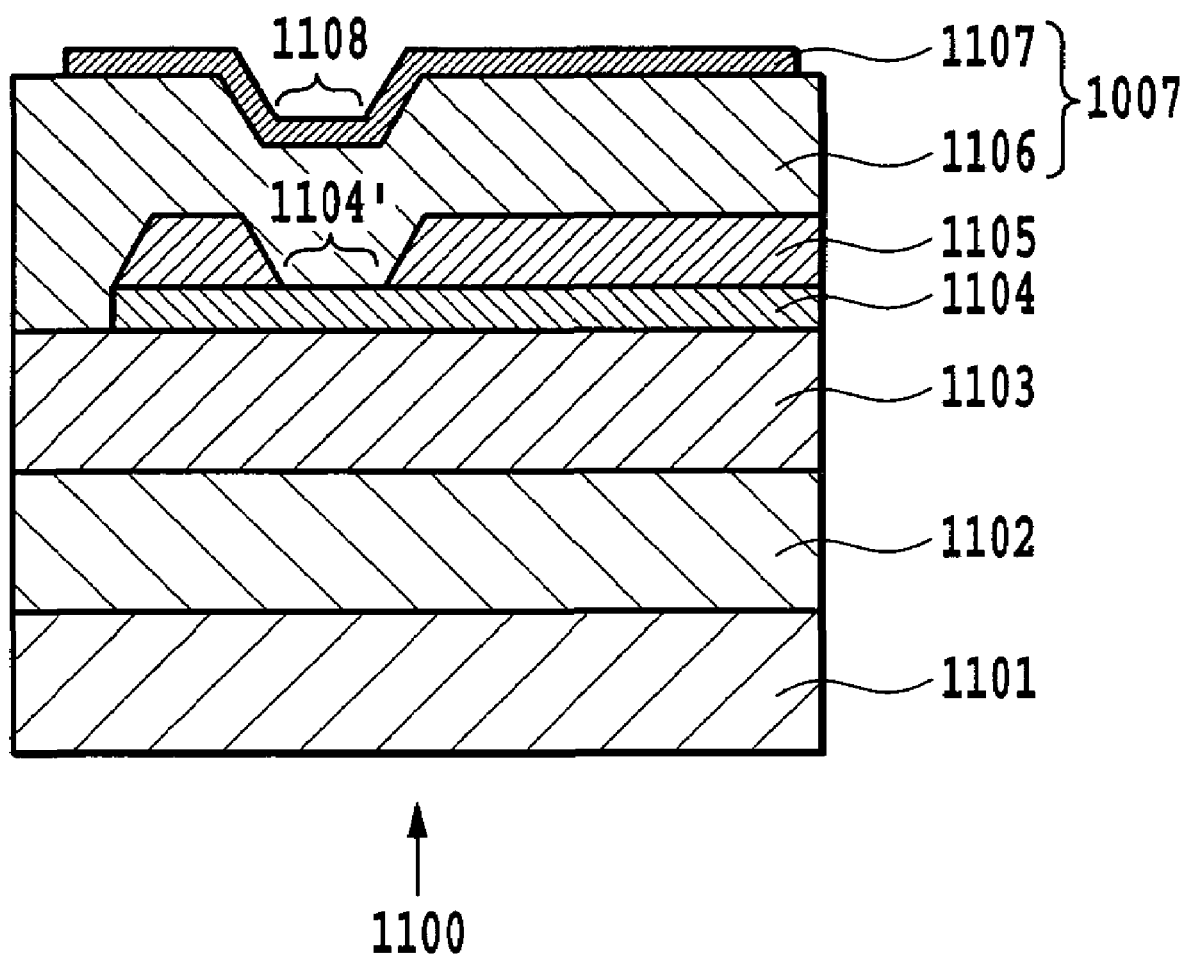
FIG. 2 is a cross-sectional view taken along the II-II line in FIG. 1.
Figure 3:
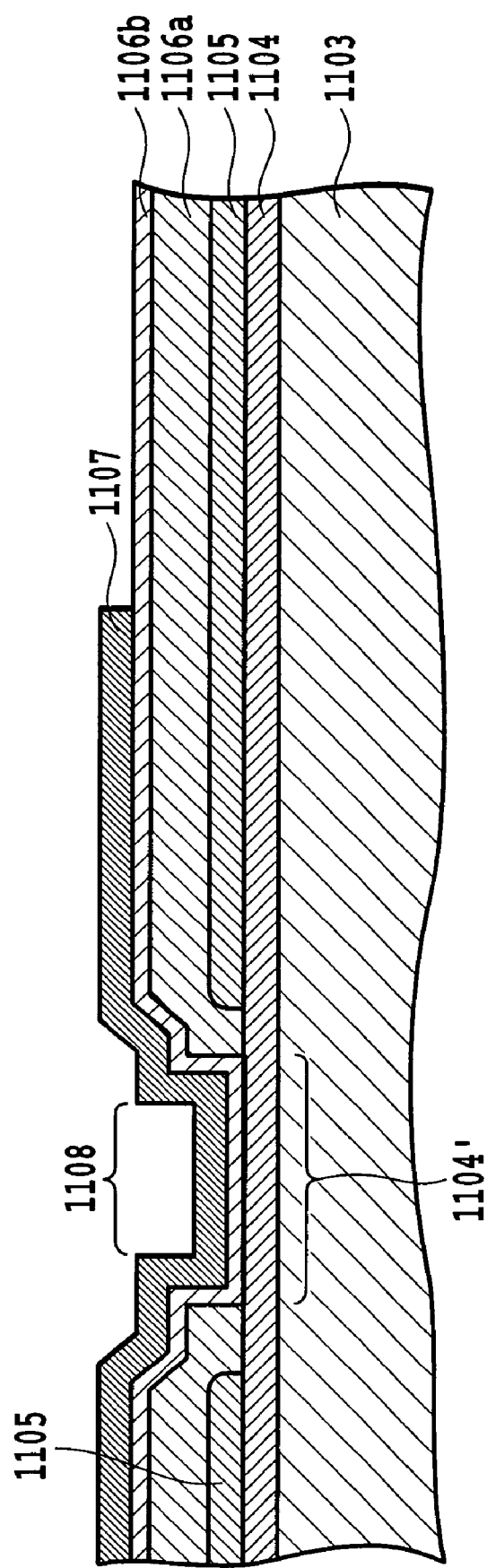
FIG. 3 is a schematic cross-sectional view of a heater of another conventional ink jet head circuit board.
Figure 4:
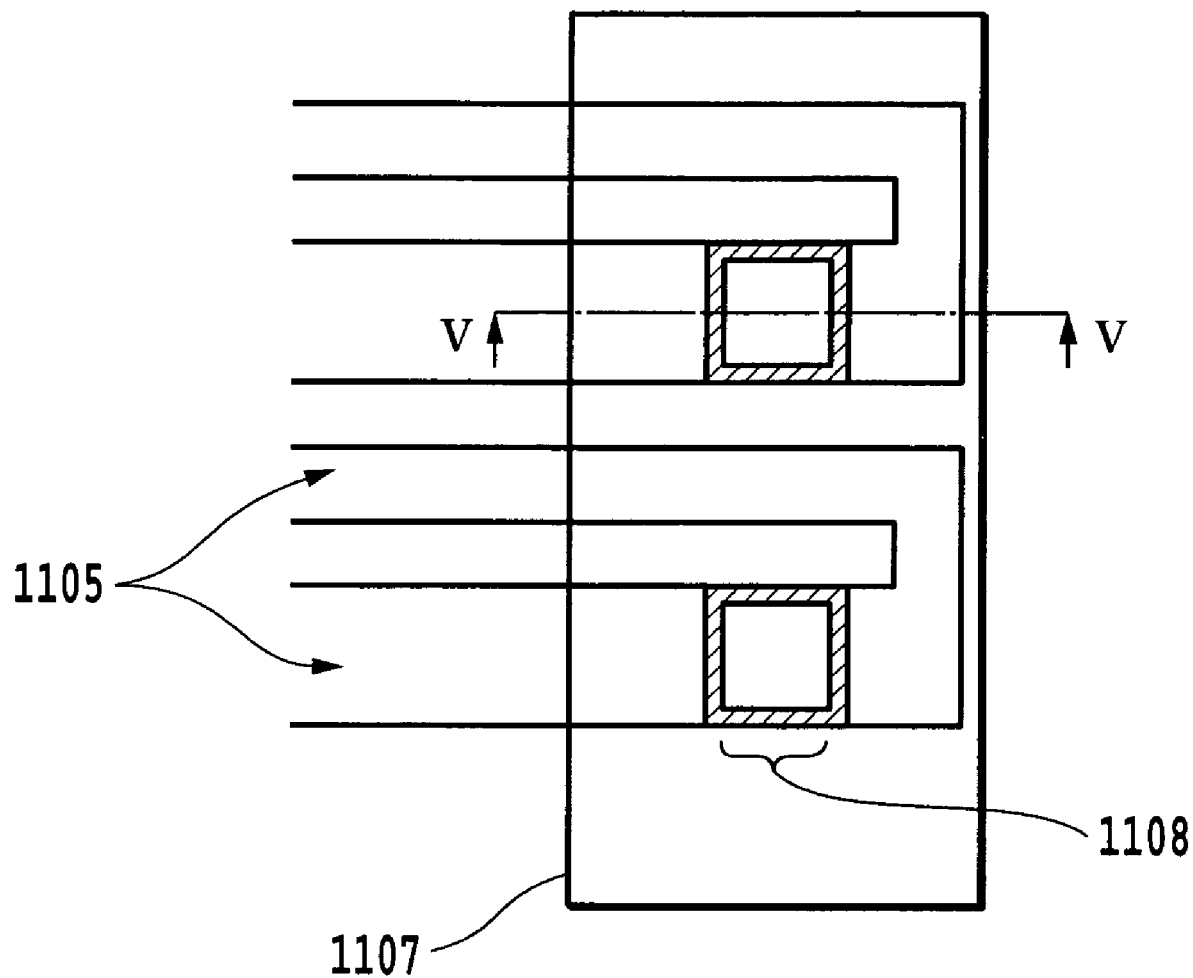
FIG. 4 is a schematic plan view of the vicinity of a heater of an ink jet head circuit board according to an embodiment of the present invention.
Figure 5:
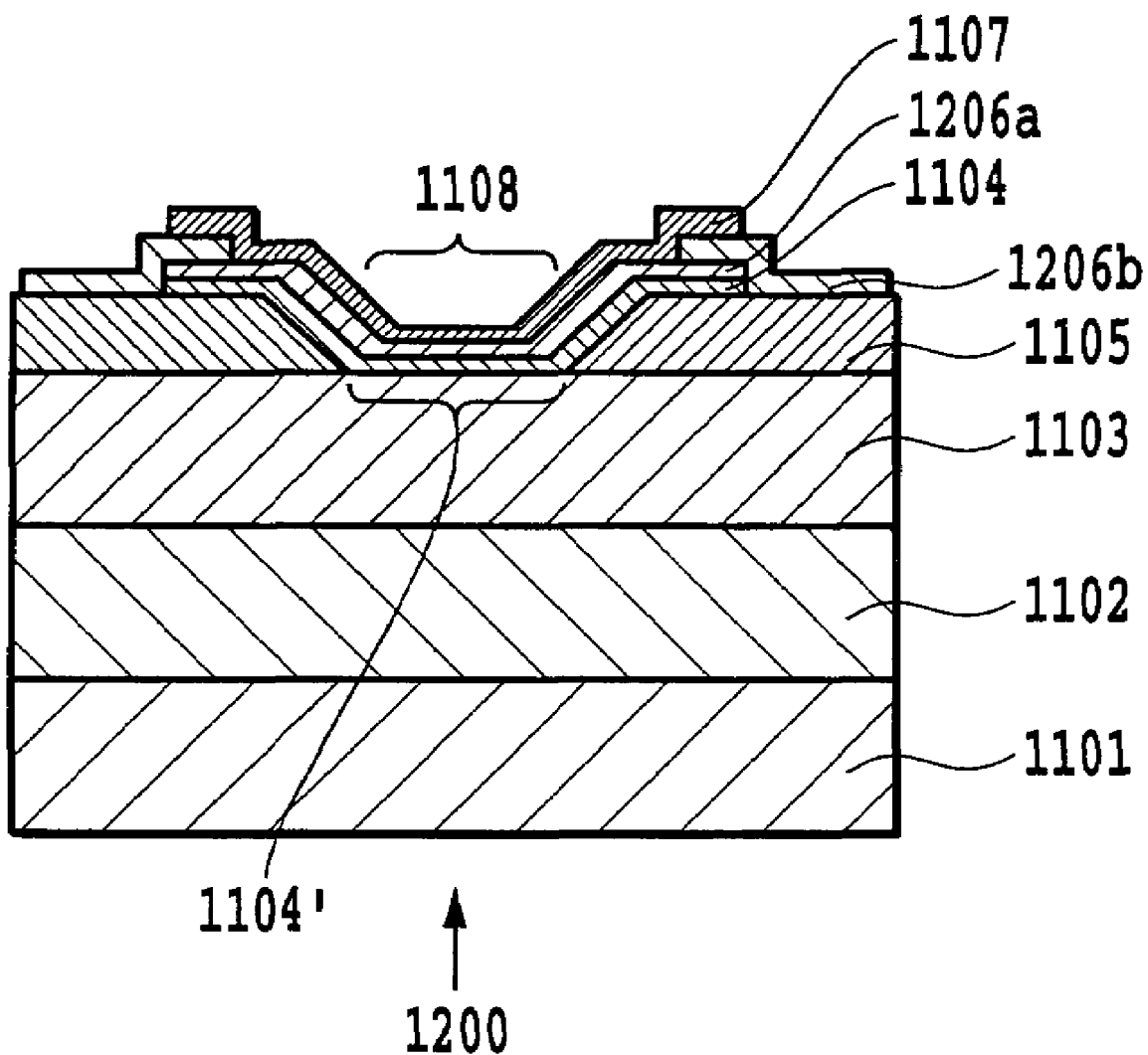
FIG. 5 is a cross-sectional view taken along the V-V line in FIG. 4.

FIG. 4 and FIG. 5 are a schematic plan view of the vicinity of a heater of an ink jet head circuit board according to a first embodiment of the present invention and a cross-sectional view taken along the V-V line of it, respectively. Here, portions functioning as similar to the respective portions in FIG. 1 to FIG. 3 are designated with the same reference numerals.

This embodiment basically applies a configuration to form two layers (1206a and 1206b) of protective layers, in which one of them is removed in a position above a heater 1104', which is a region involved in power consumption of an ink jet head, to reduce a substantial thickness of the protective layers. Specifically, in this embodiment, an electrode wire layer 1105 is patterned on an interlayer film 1103 formed on a substrate 1101 while interposing a heat accumulating layer 1102, and then a resistor layer 1104 is disposed thereon, i.e., on the electrode wire layer 1105. Moreover, after disposing first and second protective layers 1206a and 1206b, the second protective layer 1206b is removed in a site above the heater 1104'.

The embodiment of a method of manufacturing the ink jet head circuit board shown in FIG. 4 and FIG. 5 will be described with reference to FIGS. 6A to 6G.

Figure 6A:
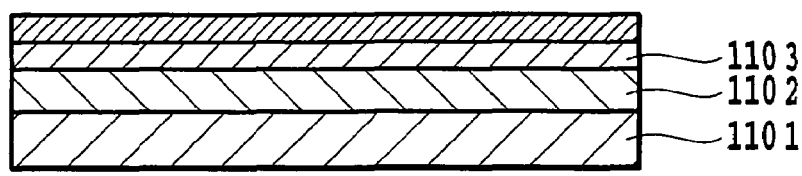
FIGS. 6A to 6G are schematic cross-sectional views for explaining a manufacturing process of a circuit board shown in FIG. 4 and FIG. 5.

First, a Si substrate or a Si substrate incorporating a driving IC in advance is used as the substrate 1101. The substrate has a Si crystal orientation of <100> in terms of a surface for forming the heater. Moreover, as shown in FIG. 6A, the heat accumulating layer 1102 having a thickness of 1.8 μm is formed on the substrate 1101 by use of thermal oxidation. In addition, a $SiO_2$ film is formed in the thickness of 1.2 μm as the interlayer film 1103 also functioning as the heat accumulating layer in accordance with a plasma CVD method or the like. Then, an Al layer constituting the electrode wire layer 1105 is formed in the thickness of about 400 nm by sputtering.

Figure 6B:
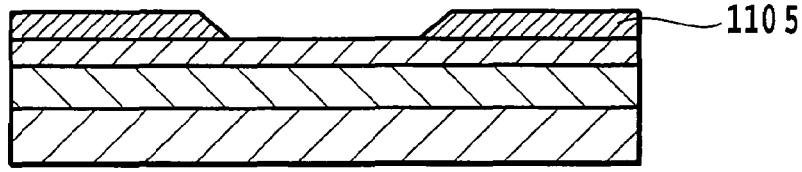

Next, as shown in FIG. 6B, dry etching is performed by use of a photolithography method and the electrode wire layer 1105 is formed by performing a patterning process on a region including a portion for constituting the heater. Here, an end portion of the patterned electrode line layer is preferably formed into a tapered shape in order to improve coverage of a layer to be formed in a subsequent process.

Figure 6C:
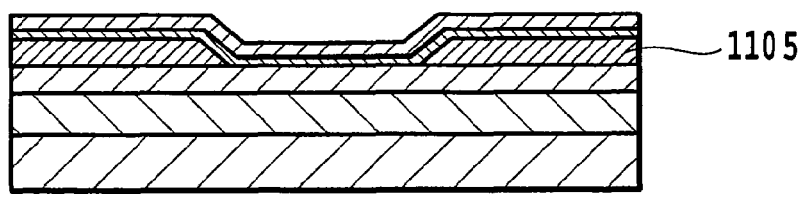

Next, a TaSiN film to constitute the resistor layer 1104 is formed in accordance with a reactive sputtering method using an alloy target made of Ta-Si. At this time, a depositing system (FIG. 7) to be described later is used, in which gas flow rates are set to 42 sccm in terms of Ar gas and to 8 sccm in terms of $N_2$ gas so as to set a $N_2$ gas partial pressure ratio to 16%. Moreover, in order to form the TaSiN film in the thickness of 40 nm, power to be applied to the target is set to 500 W and a temperature of an atmosphere is set to 200° C. while a temperature of the substrate is set to 200° C. Subsequently, the substrate is delivered to a different film forming chamber while maintaining a vacuum atmosphere and a $SiO_2$ film constituting the first protective layer 1206a is formed by use of the sputtering method. At this time, in order to form the film in the thickness of 200 nm, the gas flow rate is set to 50 sccm in terms of Ar gas, the power to be applied to a target is set to 500 W, and the temperature of the atmosphere is set to 200° C. while the temperature of the substrate is set to 200° C. (FIG. 6C).

Figure 6D:
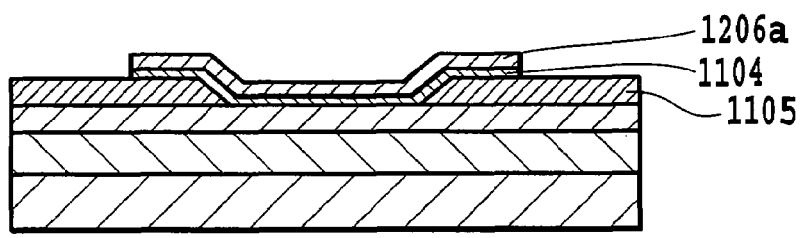

Subsequently, an etching process is performed by use of the photolithography method, whereby the resistor layer 1104 and the first protective layer 1206a are simultaneously patterned as shown in FIG. 6D.

Figure 6E:
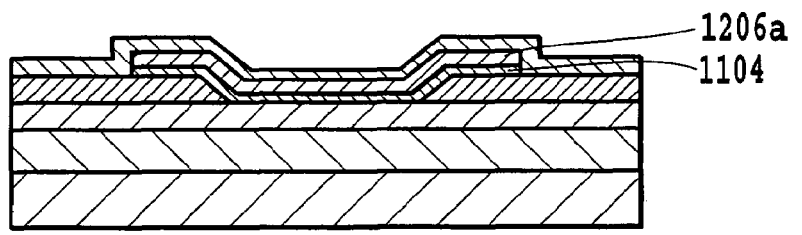

Next, a P-SiO film constituting the second protective layer 1206b is formed by use of the plasma CVD method (FIG. 6E). Here, the second protective layer 1206b is formed above the pattern-formed electrode wire layer 1105, the resistor layer 1104, and the first protective layer 1206a, and has a function to prevent entry of ink. Therefore, it is preferable to form the second protective layer 1206b as thick as possible in the range of not causing occurrence of cracks or deformation of the substrate owing to stress of the film. The thickness is set in a range from 300 nm to 5 μm inclusive, or more preferably in a range from 500 nm to 1 μm inclusive. In this embodiment, the thickness is set equal to 600 nm.

Figure 6F:
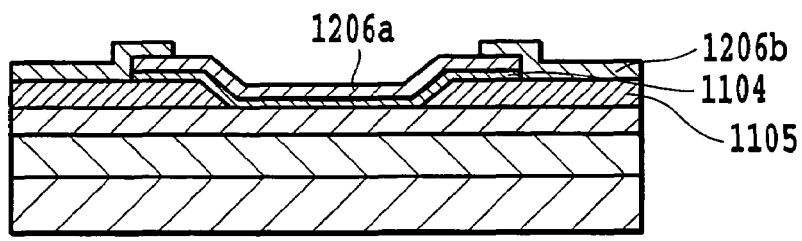
Figure 6G:
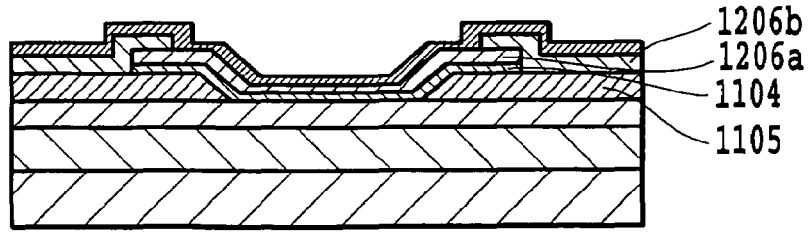

Subsequently, the second protective layer 1206b is patterned in accordance with the photolithography method to obtain a heat applying portion in the size of 20 μm×20 μm (FIG. 6F). Specifically, the heat applying portion in this embodiment is basically formed by removing the second protective layer 1206b by use of an etching process. That is, in order to use the thermal energy generated by the heater 1104' on the resistor layer 1104 effectively, it is strongly recommended to make thinner the protective layer above the heat applying portion on the heater 1104' as described previously. To achieve this, the configuration to remove the second protective layer 1206b is applied in this embodiment. A pattern-forming method of forming the desired heat applying portion is applied hereto, which may be either a dry etching method or a wet etching method. In this case, the first protective layer 1206a having denser film quality as compared to the second protective layer 1206b is formed below the second protective layer 1206b. Therefore, it is possible to etch the second protective layer 1206b with sufficient etching selectivity.

In a removing process of this embodiment, a wet etching process is performed by use of buffered hydrofluoric acid. The etching process is completed at the point when the second protective layer 1206b is etched. An etching rate in terms of buffered hydrofluoric acid is set approximately in a range from 50 to 150 nm per minute in terms of the $SiO_2$ film constituting the first protective layer 1206a, and approximately in a range from 200 to 500 nm per minute in terms of the P-SiO film constituting the second protective layer 1206b. In this way, it is possible to pattern the second protective layer 1206b with the sufficient etching selectivity.

Lastly, a Ta film constituting a high-durability protective layer 1107 is formed in the thickness of 200 nm in accordance with the sputtering method (FIG. 6G), and a circuit board 1200 shown in FIG. 5 is obtained by performing a patterning process. Here, the Ta layer has higher heat conductivity as compared to other protective layers and therefore does not reduce the thermal efficiency to a large degree. Moreover, the high-durability protective layer 1107 is directly formed on the dense and thin first protective layer 1206a. Accordingly, it is possible to allow the high-durability protective layer 1107 to transfer the thermal energy from the heater 1104' efficiently to the heat applying portion 1108 and to utilize the heat effectively for bubble generation and ink ejection.

The above-described process brings about the following remarkable effects.

First, the electrode wire layer 1105 inclusive of outer portions of steps defined by end portions facing the heater 1104' is covered with the resistor layer 1104 and the first protective layer 1206a. For this reason, it is possible to perform the patterning process for removing the second protective layer 1206 on the outside of the end portions, i.e., in a wider range than a gap of the electrode wire layer 1105 for forming the heater 1104'. Therefore, a decrease in an effective bubble generating region does not occur in contrast to the conventional example shown in FIG. 3 where the first protective layer 1106a is removed in the site shifted to the inside of the heater 1104'. This configuration is particularly effective to reduce the area of the heater in order to achieve higher-resolution and higher-image-quality printing by reducing the amount of ejected ink.

Meanwhile, in this embodiment, the resistor layer 1104 and the first protective layer 1206a are continuously formed on the electrode wire layer 1105 which is patterned in advance. In this way, the resistor layer is not affected by the etching processes and the like in contrast to the conventional example configured to form the heater by patterning the electrode wire layer after laminating the electrode wire layer on the resistor layer, and then also patterning the first protective layer 1206a after laminating the layer. For this reason, a surface of the resistor layer of this embodiment is prevented from oxidation, damages due to the etching processes, and absorption of gas or water. As a result, it is possible to dramatically reduce variation or fluctuation of values of resistance. This particularly brings about a favorable effect when reducing the thickness of the resistor layer in order to increase the resistance thereof.

Here, in the above-described process, it is possible to fabricate the resistor layer of this embodiment by use of various film forming or depositing methods. In general, it is possible to form the resistor layer by use of a magnetron sputtering apparatus applying either a radio-frequency (RF) power source or a direct-current (DC) power source as the power source thereof.

Figure 7:
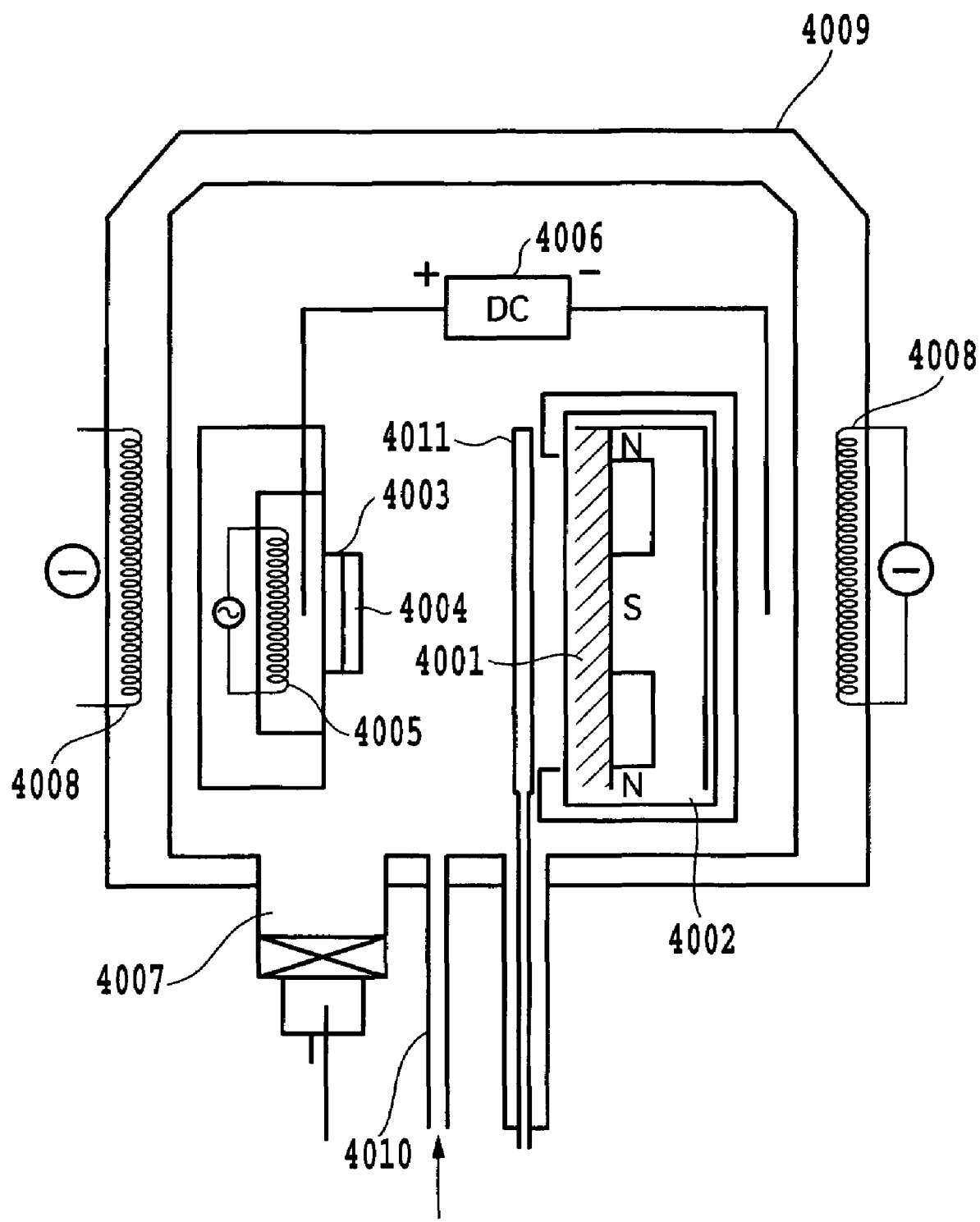
FIG. 7 is a schematic drawing showing an example of a deposition system applicable to the manufacturing process of the circuit board.

FIG. 7 shows an outline of such a sputtering apparatus. In FIG. 7, reference numeral 4001 denotes a target adjusted to a predetermined composition. Reference numeral 4002 denotes a flat plate magnet, reference numeral 4011 denotes a shutter for controlling film formation or deposition on a substrate, reference numeral 4003 denotes a substrate holder, reference numeral 4004 denotes a substrate, and reference numeral 4006 denotes a power source connected to the target 4001 and to the substrate holder 4003. Reference numeral 4008 denotes external heaters provided so as to surround an outer peripheral wall of a film forming chamber 4009. The external heaters 4008 are used for adjusting the temperature of the atmosphere in the film forming chamber 4009. An internal heater 4005 for controlling the temperature of the substrate is disposed on a rear surface of the substrate holder 4003. It is preferable to control the temperature of the substrate 4004 by use of the external heaters 4008 and the internal heater 4005.

Film formation using the apparatus shown in FIG. 7 is carried out as follows.

First, the film forming chamber 4009 is evacuated by use of an air displacement pump 4007 to a range from $1\times10^{-5}$ to $1\times10^{-6}$ Pa. Subsequently, either argon gas or mixed gas of nitrogen gas, oxygen gas, and carbon-containing gas in response to the resistor to be formed, is infused from a gas inlet 4010 into the film forming chamber 4009 via a mass flow controller (not shown). At this time, the internal heater 4005 and the external heaters 4008 are adjusted appropriately so as to set the temperature of the atmosphere and the temperature of the substrate to predetermined temperatures. Next, power is applied from the power source 4006 to the target 4001 to perform sputtering discharge, and a thin film is formed on the substrate 4004 while adjusting the shutter 4011.

In addition, it is also possible to fabricate the film for forming the protective layer 1206a as similar to the forming process of the resistor layer.

Here, the resistor layer 1104 is made of the TaSiN film in the above-described embodiment. However, it is also possible to form a film made of an alloy material such as TaAl or $HfB_2$, or other films made of TaN, TaSiO, CrSiO, TiSiC, and the like in accordance with the reactive sputtering method. Further, the resistor layer may also apply a polysilicon material and the like. In short, the material of the resistor layer is not particularly limited as long as the resistor layer can achieve a required heat generating function.

(Example Construction of Ink Jet Head and Process of Fabricating Thereof)

Now, an ink jet head using the circuit board of one of the above embodiments will be explained.

Figure 8:
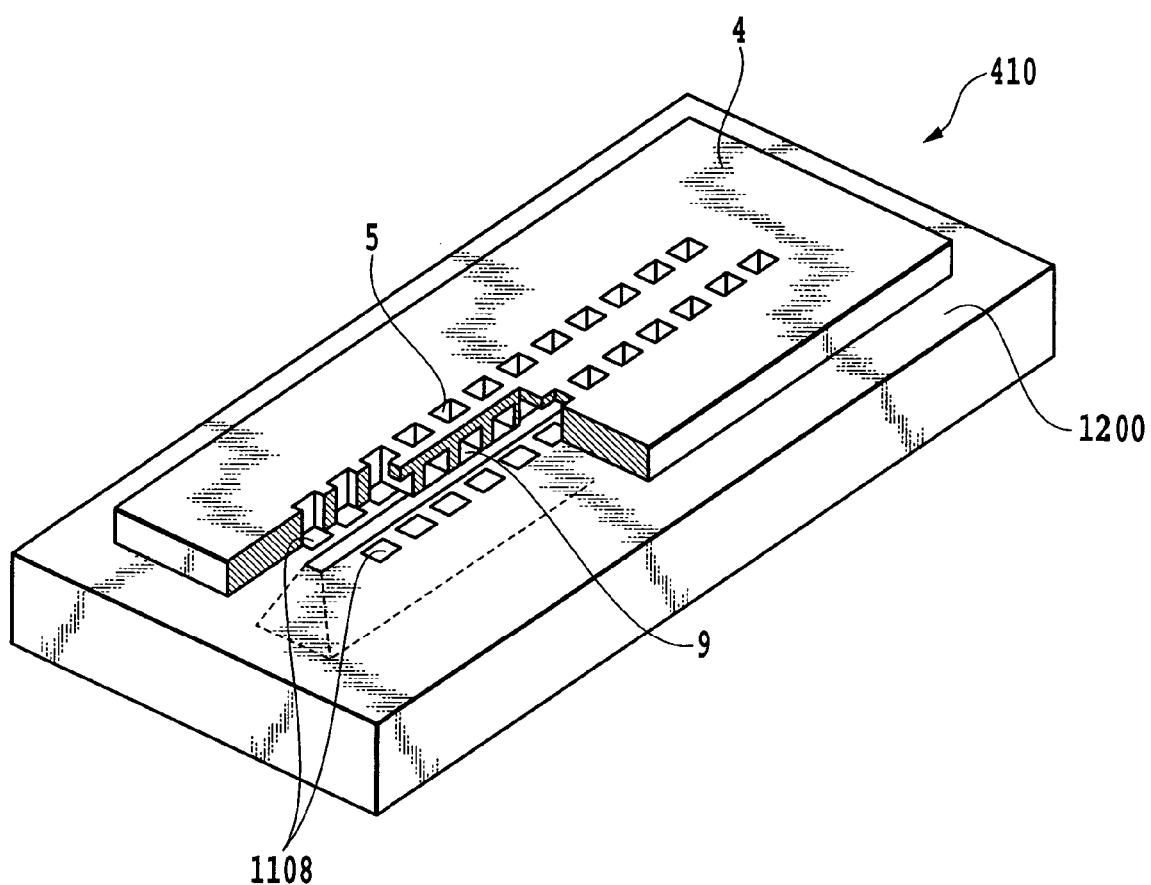
FIG. 8 is a perspective view showing an ink jet head using a circuit board of the first embodiment.

FIG. 8 is a schematic perspective view of an ink jet head.

This ink jet head has a circuit board 1 incorporating two parallel columns of heaters 102 arrayed at a predetermined pitch. Here, two circuit boards manufactured by the above process may be combined so that their edge portions where the heaters 102 are arrayed are opposed to each other, thus forming the two parallel columns of heaters 102. Or the above manufacturing process may be performed on a single circuit board to form two parallel columns of heaters in the board.

The circuit board 1 is joined with an orifice plate 4 to form an ink jet head 410. The orifice plate has formed therein ink ejection openings or nozzles 5 corresponding to the heaters 102, a liquid chamber (not shown) to store ink introduced from outside, ink supply ports 9 matched one-to-one to the nozzles 5 to supply ink from the liquid chamber to the nozzles, and a path communicating with the nozzles 5 and the supply ports 9.

Although FIG. 8 shows the two columns of heaters 102 and associated ink ejection nozzles 5 arranged line-symmetrical, they may be staggered by half-pitch to increase the print resolution.

FIG. 9A to FIG. 9D are schematic cross-sectional views showing a process of fabricating the ink jet head of FIG. 8.

The substrate for the circuit board 1 has been described to have a Si crystal orientation of <100> in those portions of a surface forming the heaters 102. Over a $SiO_2$ layer 307 on the back of the circuit board 1 a $SiO_2$ layer patterning mask 308 made of an alkali-proof masking material is formed, which is used to form an ink supply port 310. An example process of forming the $SiO_2$ layer patterning mask 308 is described as follows.

First, a mask material is spread over the entire surface on the back of the circuit board 1 as by spin coating to form the $SiO_2$ patterning mask 308, which is hardened by heat. Over the patterning mask 308, a positive resist is spin-coated and dried. Next, the positive resist is subjected to a photolithographic patterning and, with this patterned positive resist as a mask, the exposed part of the patterning mask 308 is removed by dry etching. After this, the positive resist is removed to obtain a desired pattern of the $SiO_2$ patterning mask 308.

Next, a skeleton member 303 is formed on the surface in which the heaters 102 are already formed. The skeleton member 303 is melted away in a later process to form ink paths where it was. That is, to form ink paths of a desired height and a desired plan-view pattern, the skeleton member 303 is formed into a shape of an appropriate height and plan-view pattern. The skeleton member 303 may be formed as follows.

As a material for the skeleton member 303 a positive photoresist, e.g., ODUR1010 (trade name, Tokyo Ohka Kogyo Co., Ltd make), is used. This material is applied to the circuit board 1 to a predetermined thickness as by spin coating or in the form of dry film laminate. Next, it is patterned by photolithography using ultraviolet light or deep UV light for exposure and development. Now, the skeleton member 303 of a desired thickness and plan-view pattern is obtained.

Figure 9A:
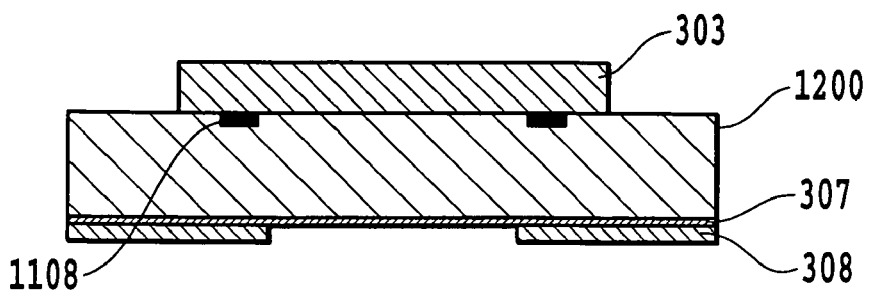
FIG. 9A to FIG. 9D are schematic cross-sectional views showing a process of fabricating the ink jet head of FIG. 8.
Figure 9B:
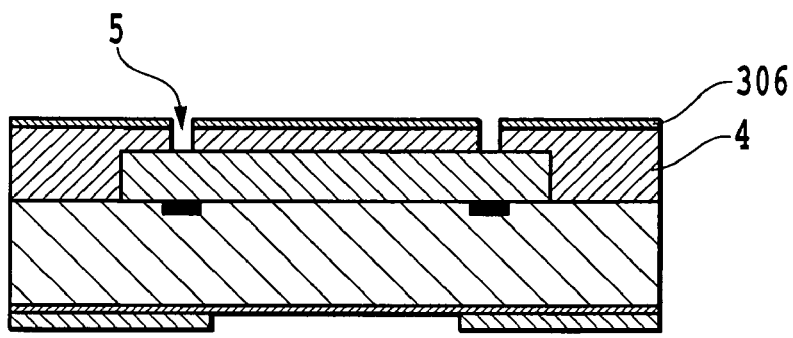

Next, in a step shown in FIG. 9B, a material of an orifice plate 4 is spin-coated to cover the skeleton member 303 that was formed on the circuit board 1 in a preceding step, and is then patterned into a desired shape by photolithography. At predetermined positions above the heaters 102, ink ejection openings or nozzles 5 are formed by photolithography. The surface of the orifice plate 4 in which the nozzles 5 are opened is covered with a water repellent layer 306 in the form of dry film laminate.

The orifice plate 4 may use a photosensitive epoxy resin and a photosensitive acrylic resin as its material. The orifice plate 4 defines ink paths and, when the ink jet head is in use, is always in contact with ink. So, photo-reactive, cationic polymers are particularly suited for its material. Further, because the durability of the material of the orifice plate 4 can change greatly depending on the kind and characteristic of the ink used, appropriate compounds other than the materials described above may be chosen according to the ink used.

Figure 9C:
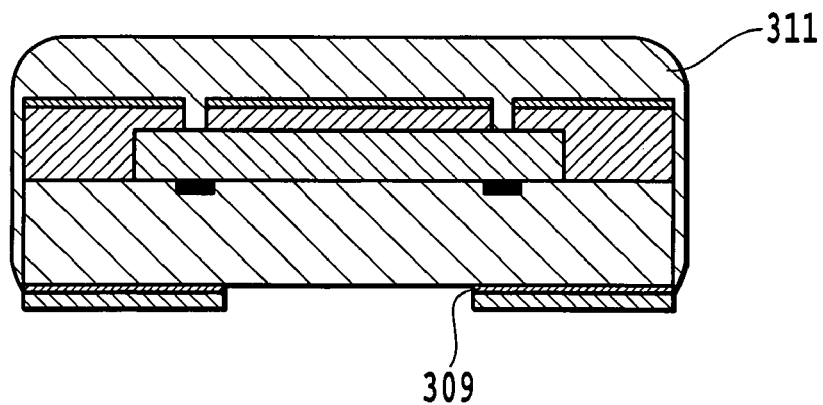

Next, in a step shown in FIG. 9C, a resin protective material 311 is spin-coated to cover the surface of the circuit board 1 in which ink jet head functional elements are already formed and its sidewall surface in order to prevent an etching liquid from contacting these surfaces when forming the ink supply port 310 piercing through the circuit board 1. The protective material 311 must have a sufficient resistance to a strong alkaline solution used during anisotropic etching. By covering the upper surface of the orifice plate 4 with this protective material 311, degradation of the water repellent layer 306 can be avoided.

Next, using the $SiO_2$ layer patterning mask 308 which was prepared in the preceding step, the $SiO_2$ layer 307 is patterned as by wet etching to form an etch start opening 309 that exposes the back surface of the circuit board 1.

Figure 9D:
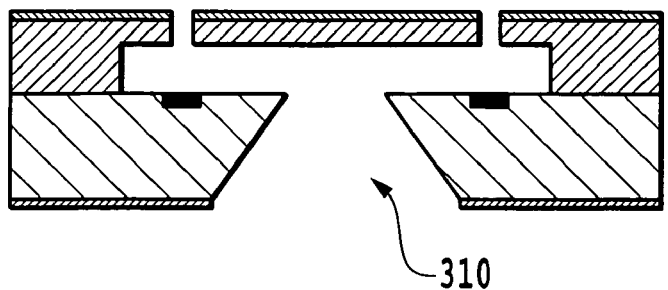

Next, in a step shown in FIG. 9D, the ink supply port 310 is formed by an anisotropic etching with the $SiO_2$ layer 307 as a mask. As an etching liquid for the anisotropic etching, a strong alkaline solution, such as TMAH (tetramethyl ammonium hydroxide) solution, may be used. Then, a solution of 22% by weight of TMAH is applied to the Si circuit board 1 from the etch start opening 309 for a predetermined time (for about a dozen hours) by keeping its temperature at 80° C. to form a piercing hole.

In a last step, the $SiO_2$ layer patterning mask 308 and the protective material 311 are removed. Then, the skeleton member 303 is melted and removed from the nozzles 5 and ink supply port 310. The circuit board is then dried. The removal of the skeleton member 303 is effected by exposing the entire surface of the circuit board to a deep UV light and then developing it. During the development, it may be subjected to ultrasonic dipping as required for virtually complete removal of the skeleton member 303.

With the above steps a main part of the ink jet head fabrication process is completed and the construction shown in FIG. 8 is obtained.

(Ink Jet Head Cartridge and Printing Apparatus)

This ink jet head can be mounted not only on such office equipment as printers, copying machines, facsimiles with a communication system and word processors with a printer unit but also on industrial recording apparatus used in combination with a variety of processing devices. The use of this ink jet head enables printing on a variety of print media, including paper, thread, fiber, cloth, leather, metal, plastic, glass, wood and ceramics. In this specification, a word "print" signifies committing to print media not only significant images such as characters and figures but also nonsignificant images such as patterns.

In the following, a cartridge comprising the above ink jet head combined with an ink tank and an ink jet printing apparatus using this unit will be explained.

Figure 10:
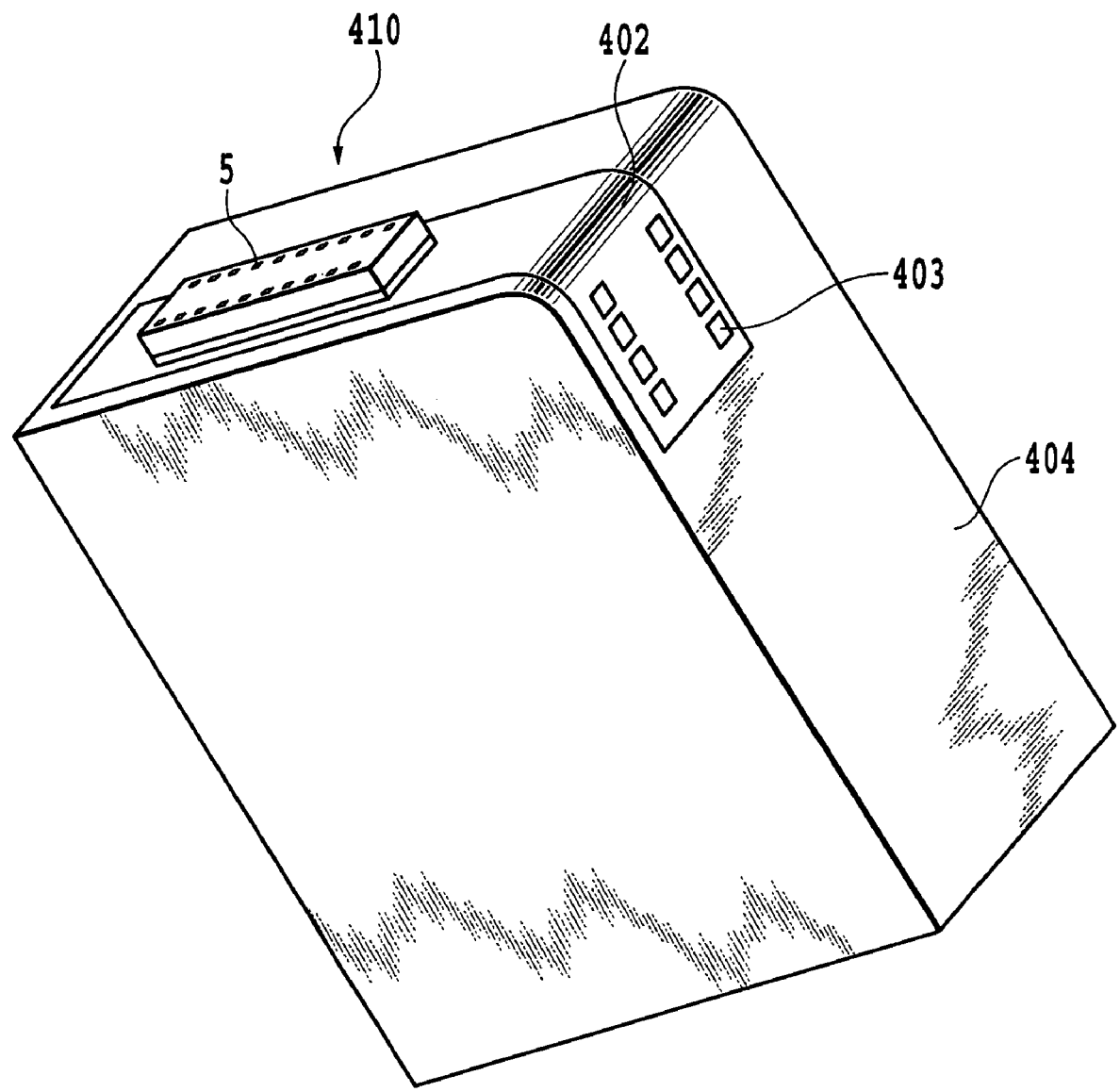
FIG. 10 is a perspective view showing an ink jet cartridge constructed of the ink jet head of FIG. 8.

FIG. 10 shows an example construction of an ink jet head unit of cartridge type incorporating the above ink jet head as its constitutional element. In the figure, denoted 402 is a TAB (tape automated bonding) tape member having terminals to supply electricity to the ink jet head 410. The TAB tape member 402 supplies electric power from the printer body through contacts 403. Designated 404 is an ink tank to supply ink to the head 410. The ink jet head unit of FIG. 10 has a cartridge form and thus can easily be mounted on the printing apparatus.

Figure 11:
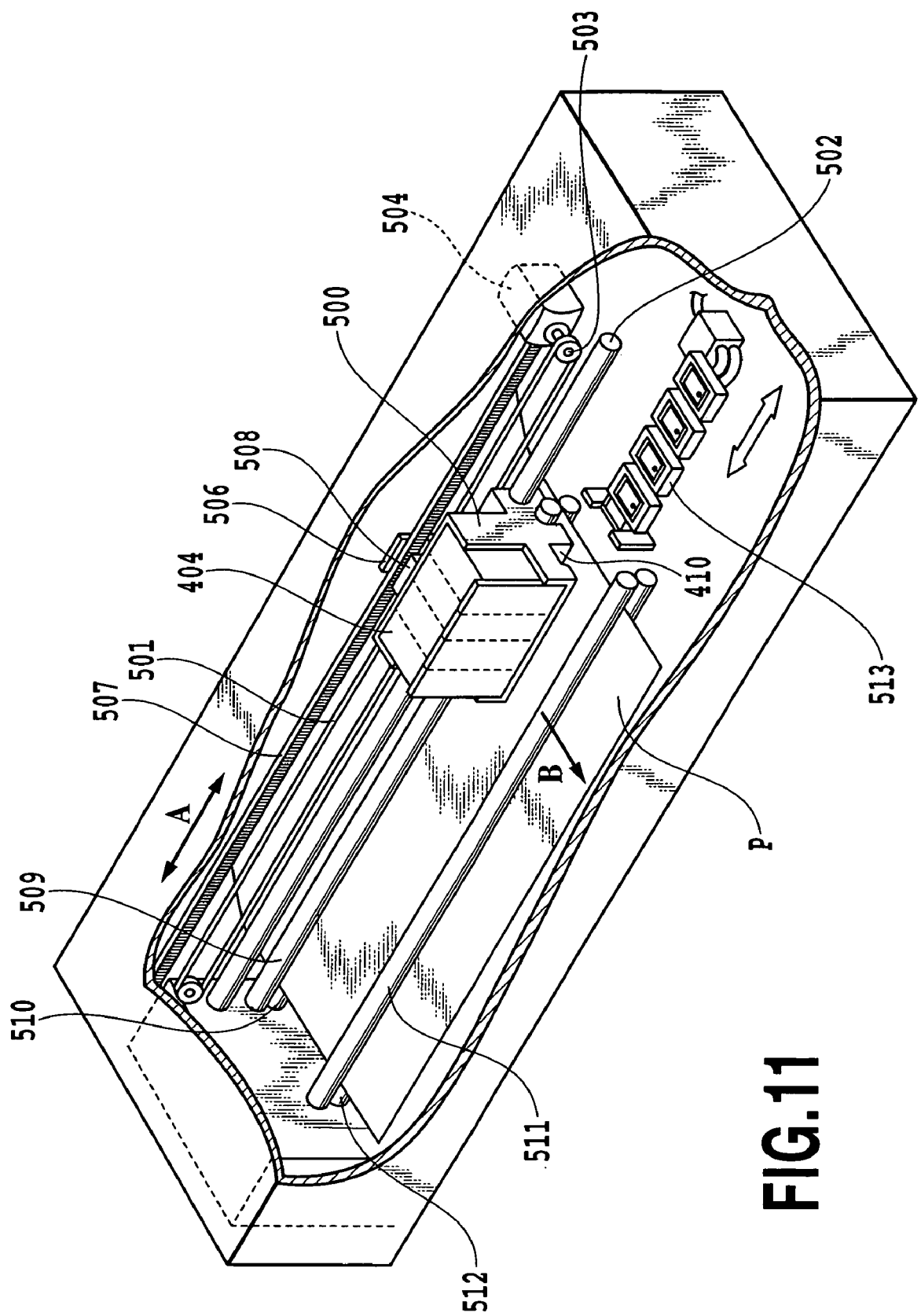
FIG. 11 is a schematic perspective view showing an outline construction of an ink jet printing apparatus using the ink jet cartridge of FIG. 10.

FIG. 11 schematically shows an example construction of an ink jet printing apparatus using the ink jet head unit of FIG. 10.

In the ink jet printing apparatus shown, a carriage 500 is secured to an endless belt 501 and is movable along a guide shaft 502. The endless belt 501 is wound around pulleys 503, 503 one of which is coupled to a drive shaft of a carriage drive motor 504. Thus, as the motor 504 rotates, the carriage 500 is reciprocated along the guide shaft 502 in a main scan direction (indicated by arrow A).

The ink jet head unit of a cartridge type is mounted on the carriage 500 in such a manner that the ink ejection nozzles 5 of the head 410 oppose paper P as a print medium and that the direction of the nozzle column agrees with other than the main scan direction (e.g., a subscan direction in which the paper P is fed). A combination of the ink jet head 410 and an ink tank 404 can be provided in numbers that match the number of ink colors used. In the example shown, four combinations are provided to match four colors (e.g., black, yellow, magenta and cyan).

Further, in the apparatus shown there is provided a linear encoder 506 to detect an instantaneous position of the carriage in the main scan direction. One of two constitutional elements of the linear encoder 506 is a linear scale 507 which extends in the direction in which the carriage 500 moves. The linear scale 507 has slits formed at predetermined, equal intervals. The other constitutional element of the linear encoder 506 includes a slit detection system 508 having a light emitter and a light sensor, and a signal processing circuit, both provided on the carriage 500. Thus, as the carriage 500 moves, the linear encoder 506 outputs a signal for defining an ink ejection timing and carriage position information.

The paper P as a print medium is intermittently fed in a direction of arrow B perpendicular to the scan direction of the carriage 500. The paper is supported by a pair of roller units 509, 510 on an upstream side of the paper feed direction and a pair of roller units 511, 512 on a downstream side so as to apply a constant tension to the paper to form a planar surface for the ink jet head 410 as it is transported. The drive force for the roller units is provided by a paper transport motor not shown.

In the above construction, the entire paper is printed by repetitively alternating the printing operation of the ink jet head 410 as the carriage 500 scans and the paper feed operation, each printing operation covering a band of area whose width or height corresponds to a length of the nozzle column in the head.

The carriage 500 stops at a home position at the start of a printing operation and, if so required, during the printing operation. At this home position, a capping member 513 is provided which caps a face of each ink jet head 410 formed with the nozzles (nozzle face). The capping member 513 is connected with a suction-based recovery means (not shown) which forcibly sucks out ink from the nozzles to prevent nozzle clogging.

(Other Embodiments)

The circuit board 1200 and the manufacturing method thereof will not be limited only to those described above. It is also possible to apply various other circuit boards and manufacturing methods thereof.

For example, it is possible to fabricate the film for forming the first protective layer 1206a by use of various film forming methods as similar to the above-described resistor layer. It is possible to form the film in accordance with a magnetron sputtering method using either a radio-frequency (RF) power source or a direct-current (DC) power source as the power source. At this time, it is also possible to apply a biased voltage to the substrate by use of the radio-frequency (RF) power source or the direct-current (DC) power source. In this way, it is possible to form a dense layer in light of the film quality.

In this case, after forming the TaSiN film constituting the resistor layer by way of a manufacturing process similar to the foregoing embodiment and delivering the substrate to a different film forming chamber while maintaining the vacuum atmosphere, it is possible to apply the following conditions when forming the $SiO_2$ film as the first protective layer 1206a. Specifically, the gas flow rate is set to 50 sccm in terms of Ar gas while the power to be applied to the target is set to 500 W, and a bias sputtering method is used to form the film while applying the RF power of 100 W to the substrate. Then, the $SiO_2$ film is formed in the thickness of 200 nm while setting the temperature of the atmosphere at 200° C. and the temperature of the substrate at 200° C.

Thereafter, an ink jet head circuit board is obtained by way of a manufacturing process similar to the foregoing embodiment, and an ink jet head is obtained by performing a process similar to those illustrated in FIGS. 9A to 9D. Here, the circuit board formed in this embodiment and the printing head applying this circuit board are defined respectively as the circuit board and the printing head according to a second embodiment. Evaluation of the second embodiment will be conducted as described later.

Meanwhile, it is also possible to apply an ECR sputtering method using electron cyclotron resonance (ECR) in order to further improve the film quality of the first protective layer 1206a. In this method, it is possible to lower gas pressure during film formation and thereby to reduce high-energy particles that enter the substrate. In this way, it is possible to form a high-purity dense film.

In this case, the $SiO_2$ film constituting the first protective layer 1206a is formed by use of the ECR sputtering method after forming the TaSiN film constituting the resistor layer 1104 by way of the manufacturing process similar to the foregoing embodiment and delivering the substrate to a different film forming chamber while maintaining the vacuum atmosphere. At this time, in order to form the film in the thickness of 200 nm, the pressure of Ar gas is set to about $2.67 \times 10^{-2}$ Pa, microwave power is set to 300 W, and the temperature of the substrate is set to 300° C.

Thereafter, an ink jet head circuit board is obtained by way of the manufacturing process similar to that of the foregoing embodiment, and an ink jet head is obtained by performing the process similar to those illustrated in FIGS. 9A to 9D. Here, the circuit board formed in this embodiment and the printing head applying this circuit board are defined respectively as the circuit board and the printing head according to a third embodiment. Evaluation of the third embodiment will be conducted as described later.

In the foregoing embodiments, the film constituting the resistor layer 1104 and the film constituting the first protective layer 1206a are formed independently. Instead, it is also possible to form a layer of a continuous film integrally in the same process by use of means for forming a film while changing a composition either continuously or stepwise in terms of the thickness direction.

Figure 12:
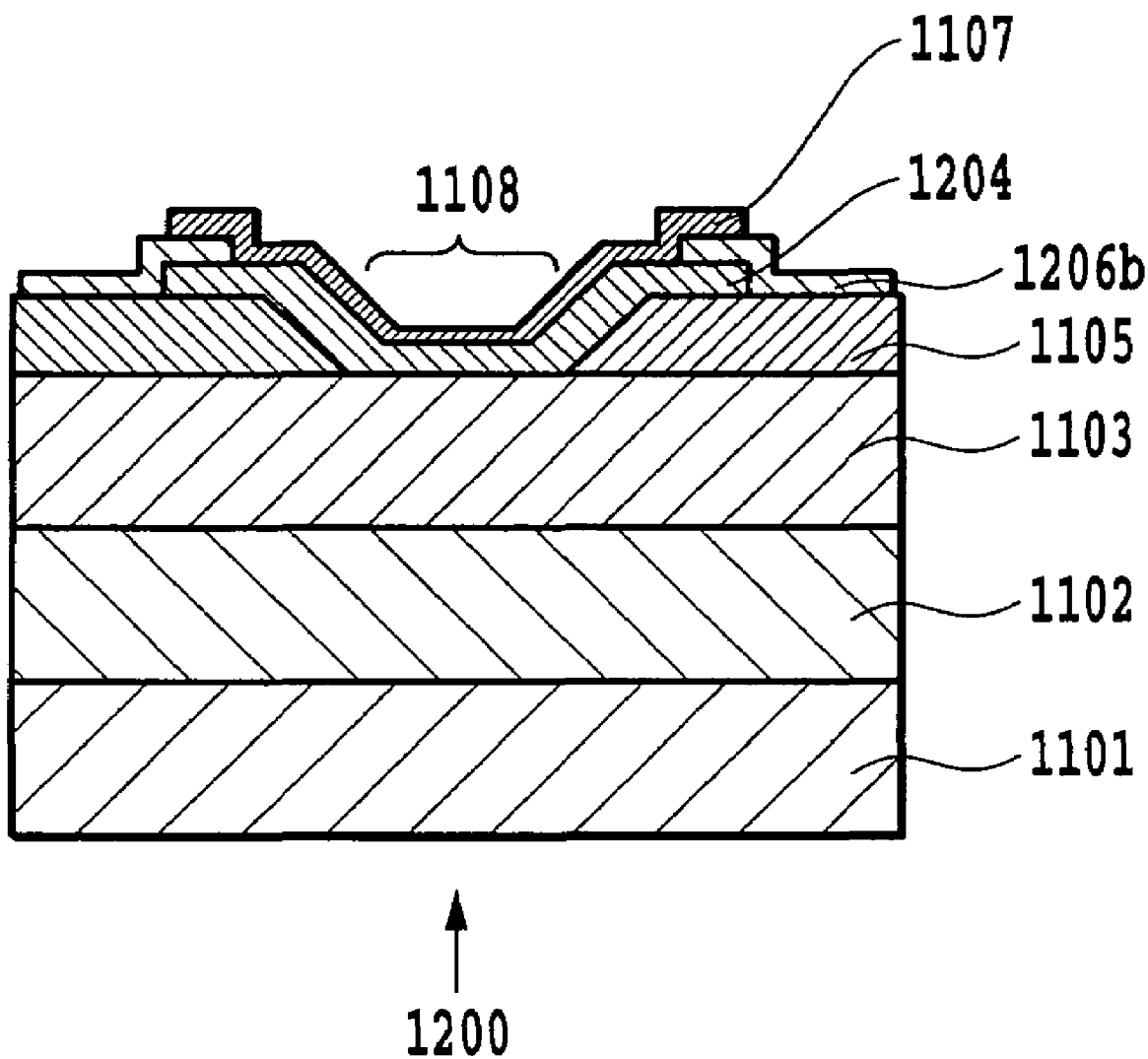
FIG. 12 is a schematic plan view of the vicinity of a heater of an ink jet head circuit board according to another embodiment of the present invention.

FIG. 12 is a schematic cross-sectional view of an ink jet head circuit board according to this embodiment. In FIG. 12, a layer 1204 configured to serve as a resistor layer and a first protective layer is disposed. Here, a portion of the film to exert a function as a resistor is formed by relatively reducing a proportion of reactive gas (which may be nitrogen, oxygen, or carbon-containing gas in response to the type of the resistor) used for forming the resistor relative to the entire gas. Then, a portion of the film to exert a function as a protective layer (the first protective layer) can be formed by increasing the proportion of the reactive gas either continuously or stepwise so that the portion constitutes an electrically insulative body.

Here, the resistor of this embodiment is made of a material expressed as $\alpha x \beta y \gamma z$, in which $\alpha$ can be at least one element selected from the group consisting of Ta, Ti, Zr, Cr, Mo, and Hf, $\beta$ can be at least one element selected from the group consisting of Si and B, and $\gamma$ can be at least one element selected from the group consisting of C, O, and N (where $x+y+z=100\%$). Accordingly, it is possible to form the layer made of the continuous film integrally and in the same process by setting the $\beta$ element and the $\gamma$ element of the first protective layer as the same elements as those in the resistor.

For example, the layer 1204 can be formed by the following process assuming that the resistor is made of TaSiN and the first protective layer is made of SiN.

Firstly, after forming the electrode wire layer 1105 by way of a manufacturing process similar to that of the foregoing embodiment, the resistor layer and the first protective layer 1206a are continuously formed by applying a two-source simultaneous sputtering method applying two targets made of Ta and Si while changing the composition in terms of the thickness direction. Specifically, when forming the portion of the film functioning as the resistor, gas flow rates are set to 42 sccm in terms of Ar gas and to 8 sccm in terms of $N_2$ gas so as to set a $N_2$ gas partial pressure ratio to 16%. Meanwhile, the power to be applied to the targets is set to 150 W in terms of the Si target and to 500 W in terms of the Ta target. In addition, the temperature of the atmosphere is set to 200° C. and the temperature of the substrate is set to 200° C., thus forming the TaSiN film in the thickness of 30 nm. Subsequently, to form the portion functioning as the first protective layer, the gas flow rates are set to 42 sccm in terms of Ar gas and to 25 sccm in terms of $N_2$ gas so as to set the $N_2$ gas partial pressure ratio to about 37%. Then, the power to be applied to the targets is set to 500 W in terms of the Si target and to 0 W in terms of the Ta target. In addition, the temperature of the atmosphere is set to 200° C. and the temperature of the substrate is set to 200° C., thus forming the SiN film in the thickness of 250 nm.

Thereafter, an ink jet head circuit board can be obtained by way of the manufacturing process similar to that of the foregoing embodiment, and an ink jet head can be obtained by performing the process similar to those illustrated in FIGS. 9A to 9D. Here, the circuit board formed in this embodiment and the printing head applying this circuit board are defined respectively as the circuit board and the printing head according to a fourth embodiment. Evaluation of the fourth embodiment will be conducted as described later.

Here, the proportion of the reactive gas and the power to be applied to the Ta target are changed stepwise in this embodiment. However, it is also possible, by changing these parameters continuously, to form the layer which has the variation of the composition changing continuously in terms of the thickness direction.

(Evaluation of Circuit Boards and Ink Jet Heads)

A hundred sheets of the ink jet head circuit boards are continuously fabricated in terms of each of the configurations according to the first to fourth embodiments. Variation in the values of resistance in the lot (100 sheets) is checked by measuring the values of resistance in the circuit board (at 9 points in each board). Results are shown in Table 1.

TABLE 1

| | Variation of values of resistance among circuit boards [±%] (among 100 sheets) | | |
|---|---|---|---|
| | 1st sheet | 50th sheet | 100th sheet |
| First embodiment | 1.9 | 1.8 | 1.7 |
| Second embodiment | 1.8 | 1.6 | 1.7 |
| Third embodiment | 1.5 | 1.4 | 1.5 |
| Fourth embodiment | 1.5 | 1.6 | 1.6 |

On the contrary, the variation in the values of resistance reaches approximately in a range from ±4% to ±5% in the configuration shown in FIG. 3. From these data, it is apparent that the circuit boards according to the respective embodiments of the present invention have effects to reduce variation or fluctuation in the values of resistance. This is attributable to the fact that the resistor layer and the first protective layer are continuously formed on the electrode wire layer patterned in advance in each of the embodiments. Accordingly, the surface of the resistor layer is prevented from oxidation, damages caused by the etching processes, and absorption of gas or water.

Next, ink jet heads according to the first to fourth embodiments, the ink jet heads being formed by use of the circuit boards of the respective embodiments, are mounted to an ink jet printing apparatus, and a printing endurance test is executed in terms of each of the ink jet heads. This test is conducted by printing a typical test pattern embedded in the ink jet printing apparatus on A4-sized (210 mm×297 mm) paper sheets. Here, a pulse signal having a drive frequency at 15 kHz and a drive pulse width of 1 μs is applied to find a bubble generation starting voltage Vth where the ink jet head starts ejection. Results are shown in Table 2.

TABLE 2

| | Bubble generation starting voltage Vth [V] | Drive voltage Vop [V] |
|---|---|---|
| First embodiment | 15.6 | 20.3 |
| Second embodiment | 15.0 | 19.5 |
| Third embodiment | 14.5 | 18.9 |
| Fourth embodiment | 15.2 | 19.8 |

The bubble generation starting voltage Vth is equal to 17.0 V in the case of the ink jet head of the configuration of FIG. 3 in which the thickness of the second protective layer is set to 300 nm. On the contrary, the results shown in Table 2 are obtained with the ink jet heads of the respective embodiments in which the thickness of the first protective layer is set to 200 nm. Accordingly, the Vth value is reduced approximately by 10% to 15%. In this way, improvement in the power consumption is confirmed.

Next, a standard text containing 1500 letters is printed by setting a value 1.3 times as large as the Vth value as the drive voltage Vop. As a result, it is confirmed that any of the heads according to the first to fourth embodiments is able to print more than 10000 sheets without deterioration in the printing quality. That is, it is confirmed that the ink jet head applying the present invention is able to print stable images for a long period, and is also excellent in an endurance characteristic.

The present invention has been described in detail with respect to preferred embodiments, and it will now be apparent from the foregoing to those skilled in the art that changes and modifications may be made without departing from the invention in its broader aspect, and it is the intention, therefore, in the apparent claims to cover all such changes.

This application claims priority from Japanese Patent Application No. 2004-325534 filed Nov. 9, 2004, which is hereby incorporated by reference herein.

What is claimed is:

1. An ink jet head circuit board having a heater for generating thermal energy to be used for ejecting ink in response to application of electricity, the ink jet head comprising:
    an electrode wire layer including a first gap;
    a resistor layer disposed as an upper layer of the electrode wire layer inclusive of the first gap;
    a first protective layer disposed as an upper layer of the resistor layer; and
    a second protective layer including a second gap, disposed as an upper layer of the first protective layer,
    wherein a portion of the resistor layer corresponding to the first gap becomes the heater, the second protective layer is not formed on the heater, the second protective layer is positioned on the first gap, and the second gap is wider than the first gap.

2. The ink jet head circuit board as claimed in claim 1, wherein the first protective layer has relatively dense film quality, and the second protective layer has relatively sparse film quality.

3. The ink jet head circuit board as claimed in claim 1, wherein the first protective layer is made of $SiO_2$, and the second protective layer is made of P-SiO.

4. The ink jet head circuit board as claimed in claim 1, wherein the resistor layer and the first protective layer are formed as portions of a layer having a composition changing continuously or stepwise in a thickness direction.

5. An ink jet head comprising:
    the ink jet head circuit board as claimed in claim 1; and
    an ink nozzle corresponding to the heater.

* * * * *